(12) United States Patent
Hunger

(10) Patent No.: US 6,487,744 B2
(45) Date of Patent: Dec. 3, 2002

(54) DEVICE FOR CLEANING A WAFER OF ABRASIVE AGENT SUSPENSION REMAINING AFTER POLISHING WITH BRUSHES AND DI WATER

(75) Inventor: Rüdiger Hunger, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/946,850

(22) Filed: Sep. 4, 2001

(65) Prior Publication Data

US 2002/0038486 A1 Apr. 4, 2002

(30) Foreign Application Priority Data

Sep. 1, 2000 (DE) .......................................... 100 43 213

(51) Int. Cl.$^7$ ................................................ B08B 11/02
(52) U.S. Cl. .............................. 15/77; 15/21.1; 15/88.2; 15/102
(58) Field of Search .......................... 15/21.1, 77, 88.2, 15/102

(56) References Cited

U.S. PATENT DOCUMENTS

| 4,141,180 A | 2/1979 | Gill, Jr. et al. |
| 5,329,732 A | 7/1994 | Karlsrud et al. |

FOREIGN PATENT DOCUMENTS

| DE | 43 45 408 A1 | 7/1997 |
| JP | 10270391 | 10/1998 |
| JP | 11097397 A | 4/1999 |

Primary Examiner—Randall E. Chin
(74) Attorney, Agent, or Firm—Laurence A. Greenberg; Werner H. Stemer; Ralph E. Locher

(57) ABSTRACT

A device for cleaning a wafer of abrasive agent suspension (slurry) remaining after polishing with brushes and DI water includes an upper gear casing having an upper side with an end, a motor in the upper gear casing, a drive shaft, an upper gear mechanism, and a lower gear casing substantially mirroring the upper gear casing. The lower receiving plate and upper receiving plate form a brush unit, between which a part of a wafer can be clamped and cleaned by rotating the brush unit. The lower gear mechanism turns the lower drive wheel in a same direction as the upper drive wheel. The cleaning is achieved by a rotational movement of a number of pairs of brushes (scrubber brushes) on both sides of the wafer and the application of deionized water.

5 Claims, 3 Drawing Sheets

DEVICE FOR CLEANING A WAFER OF ABRASIVE AGENT SUSPENSION REMAINING AFTER POLISHING WITH BRUSHES AND DI WATER

BACKGROUND OF THE INVENTION

Field of the Invention

The invention relates to a device for cleaning a wafer of abrasive agent suspension (slurry) remaining after polishing with brushes and DI water.

The fabrication of integrated circuits begins with the production of high-quality semiconductor wafers. These wafers are usually subjected to a polishing operation to provide an extremely level starting surface of the wafers. During the subsequent structuring of the substrate, it is known to build up on the wafer, inter alia, layers of, for example, conductors and dielectrics, on which then other such layers are in turn to be produced. With structuring becoming ever finer, the associated replication processes are becoming more sensitive to surface variations on the substrate. Therefore, it has now become necessary to "re-level" the wafer surface even while the production of the integrated circuit is in progress. The re-leveling operation is referred to as planarizing and is nowadays usually accomplished with the CMP method: that is, with the aid of a chemical-mechanical polishing process.

The joint effect of a polishing surface onto which an abrasive agent suspension (slurry) is being pumped and the relative movement between the polishing surface and the wafer in this case produces a combined mechanical and chemical process on the surface of the wafer. This process creates a highly level surface on the wafer. In order to remove the still moist remains of slurry after the CMP process, cleaning steps are required, since the remains of slurry otherwise crystallize or, due to highly contaminated wafers, the defect density increases and the service life of the brush cleaners (following equipment for cleaning the wafers of particles) is reduced.

One of the pre-cleaning steps after the chemical-mechanical polishing process is completed with a brush device (also known as a scrubber). In this case, a special washing fluid and a rotational movement with a number of pairs of brushes (scrubber brushes) can clean both sides of the wafer with contact pressure. Because the wafer becomes considerably more valuable with each successive planarizing operation, the brush cleaning operations is commercially very significant.

A brush device with gear casings disposed one above the other, between which three brush units are disposed, between which in turn a wafer can be clamped and in which the device as a whole is displaceable horizontally in relation to the wafer between a cleaning position with the clamped-in wafer and a stationary position, is known for example from German Published, non-prosecuted application DE 43 45 408 A1, which corresponds to U.S. Pat. No. 5,329,732. In this case, it is also known to connect the drive wheels, which rotate inside each gear casing and drive the rotating brushes under the upper gear casing and above the lower gear casing, respectively via a shaft, to the drive shaft of a motor via a belt gear mechanism.

Furthermore, it is known in this case to provide nozzles for deionized water (DI water) on the upper side of the upper gear casing. Moistening of the brushes is also necessary in the stationary position because they otherwise dry out and harden, which subsequently has adverse effects on the water and brushes.

However, the inadequate sealing with respect to the chemically aggressive DI water and the confinements determined by the belt drive mechanism prevent synchronous running of the brushes within a set of brushes and of the brushes assigned to one another of a brush unit. It also prevents the contact pressure from being maintained. Therefore, the known brush device is relatively temperamental. The resulting frequent failure of the brush device goes unnoticed in many cases causing batches (for example 25 wafers) to be processed further without the required cleaning. This increases defect density and, in the worst case, costs up to one percent (1%) of the yield. The frequent failures, even when they are noticed, are problematical because they cause failure times of several hours. For example, complex maintenance work is required for the repair of the toothed belts and the exchange of the bearings.

A device for polishing wafers is described in German published, non-prosecuted application DE 43 45 408 A1. The device has a number of wafer carriers disposed in a circle. Each wafer carrier is assigned a polishing device, which is driven via a shaft. The shaft is in connection via a step-down gear mechanism with an AC servomotor, which drives the shaft. The wafer carrier itself is not rotated in this case.

The abstract of JP 11-097397 A discloses a cleaning device for wafers, two brushes which lie opposite each other and work a wafer from two sides simultaneously being provided. Each of the brushes is driven by a motor of its own.

Gill Jr., et al. (U.S. Pat. No. 4,141,180) disclose a polishing device for wafers. The polishing device has two polishing surfaces disposed next to each other. Both polishing surfaces are driven via a belt by a central rotary shaft.

The abstract of JP 10-270391 A discloses a polishing device for wafers that has a plurality of brushes that are coupled to one another via toothed gearwheels.

SUMMARY OF THE INVENTION

It is accordingly an object of the invention to provide a device for cleaning a wafer of abrasive agent suspension remaining after polishing with brushes and DI water that overcomes the hereinafore-mentioned disadvantages of the heretofore-known devices of this general type and that has increased service life and availability of a scrubber, a reduction in the failure times, and a minimization of the repair costs. The brush device should typically be part of a machine system virtually the size of a room, in which the semiconductor wafers, or similar items of material, are polished, transported, cleaned or otherwise processed in a number of stations. The structural design modifications should therefore fit into the overall system.

With the foregoing and other objects in view, there is provided, in accordance with the invention, a device for cleaning a wafer of abrasive agent suspension (slurry) remaining after polishing with brushes and DI water. The device includes an upper gear casing having an upper side with an end. The upper gear casing is impervious to washing fluid.

A motor is disposed on the end and is encapsulated in the upper gear casing. A drive shaft connects to the motor running perpendicular to the upper side. An upper gear mechanism encapsulated in the upper gear casing and connected to the drive shaft includes an intermediate wheel having teeth turned by the drive shaft, an upper drive wheel having teeth intermeshed with and driven by the intermediate wheel, a shaft connected to the upper drive wheel, and a receiving plate for holding a brush connected to and driven by the upper drive wheel via the shaft. The receiving plate is disposed underneath the upper gear casing, parallel to the upper side.

A coupling connects to the drive. A lower gear casing substantially mirrors the upper gear casing. The lower gear casing receives the coupling. The lower gear casing and the upper gear casing having are fixed one above the other. A lower gear mechanism encapsulated in the lower gear casing including an intermediate wheel having teeth rotated by the coupling, and a lower drive wheel having teeth intermeshed with and rotated by the intermediate wheel and connected via a shaft to a lower receiving plate for holding brushes. The lower receiving plates are coaxial with the upper receiving plate. The lower receiving plate and upper receiving plate form a brush unit, between which a part of a wafer can be clamped and cleaned by rotating the brush unit. The lower gear mechanism turns the lower drive wheel in a same direction as the upper drive wheel.

In accordance with a further object of the invention, the device includes a moistening system for the brush units integrated into a lower casing wall of the upper gear casing. The moistening system is sealed and separated from the upper gear mechanism.

In accordance with a further object of the invention, the device includes shaft sealing rings each sealing a shaft into a respective gear casing.

In accordance with a further object of the invention, the gear transmissions include a first brush unit, a second brush unit, and a third brush unit, all disposed along a longitudinal direction of the gear casings. The second brush unit is offset in a transverse direction. In addition, each of the gear transmission include three intermediate wheels intermeshed in series connecting the drive shaft to the first drive wheel. A further intermediate wheel is intermeshed and interposed with the first drive wheel and the second drive wheel. A further intermediate wheel is intermeshed with and connects the second drive wheel and the third drive wheel.

In accordance with a further object of the invention, the gear casings are formed from natural polypropylene.

The invention is based on the idea of modifying the type of gear mechanism while maintaining the overall configuration and ensuring that the scrubber brushes rotate in the same direction and apply a defined contact pressure. The new type of gear mechanism is a toothed gear mechanism. At the same time, measures for sealing the gear mechanism have been provided because, for example, incrustations in the interior of the newly configured gear mechanism are much more critical than in the case of the known belt gear mechanism. Furthermore, the geometrical form of the brush device can be simplified and made flatter within the new configuration.

A particularly advantageous embodiment of this device includes a moistening system for the brush units that is integrated into the lower casing wall of the upper gear casing in such a way that it is separated in a sealed manner from the gear mechanism there. The integration of the DI water feed line at this position of the upper gear casing ensures, while DI water continues to run, the constant moistening of the brushes, even in the stationary position, in order that they cannot dry out and consequently harden. This makes it possible to dispense with an external moistening system and sealing of it, for example in relation to a bushing through the upper gear casing.

In relation to the integrated moistening system and the sealing generally, it is also very advantageous to additionally provide shaft sealing rings, with which the transition of a shaft respectively into the associated gear casing is sealed off.

In the new surroundings according to the invention, with the necessary sealed encapsulation, corresponding requirements have to be imposed on the selection of materials. For the outer-lying parts of the brush device, the use of materials resistant to DI water, corresponding to clean room guidelines, is recommendable. In particular, it is advantageous to choose natural polypropylene (PP natural) as the material for the two gear casings, since this material is hydro stable and chemically resistant. The shaft sealing rings mentioned above are also available in materials appropriate for clean room conditions.

The modifications mentioned have the effect of increasing the service life of the brush device many times over and significantly reducing the probability of failure. The invention also minimizes maintenance costs. In addition, the yield is ensured and the availability of other equipment, for example the brush cleaner, is increased.

Other features that are considered as characteristic for the invention are set forth in the appended claims.

Although the invention is illustrated and described herein as embodied in a device for cleaning a wafer of abrasive agent suspension remaining after polishing with brushes and DI water, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
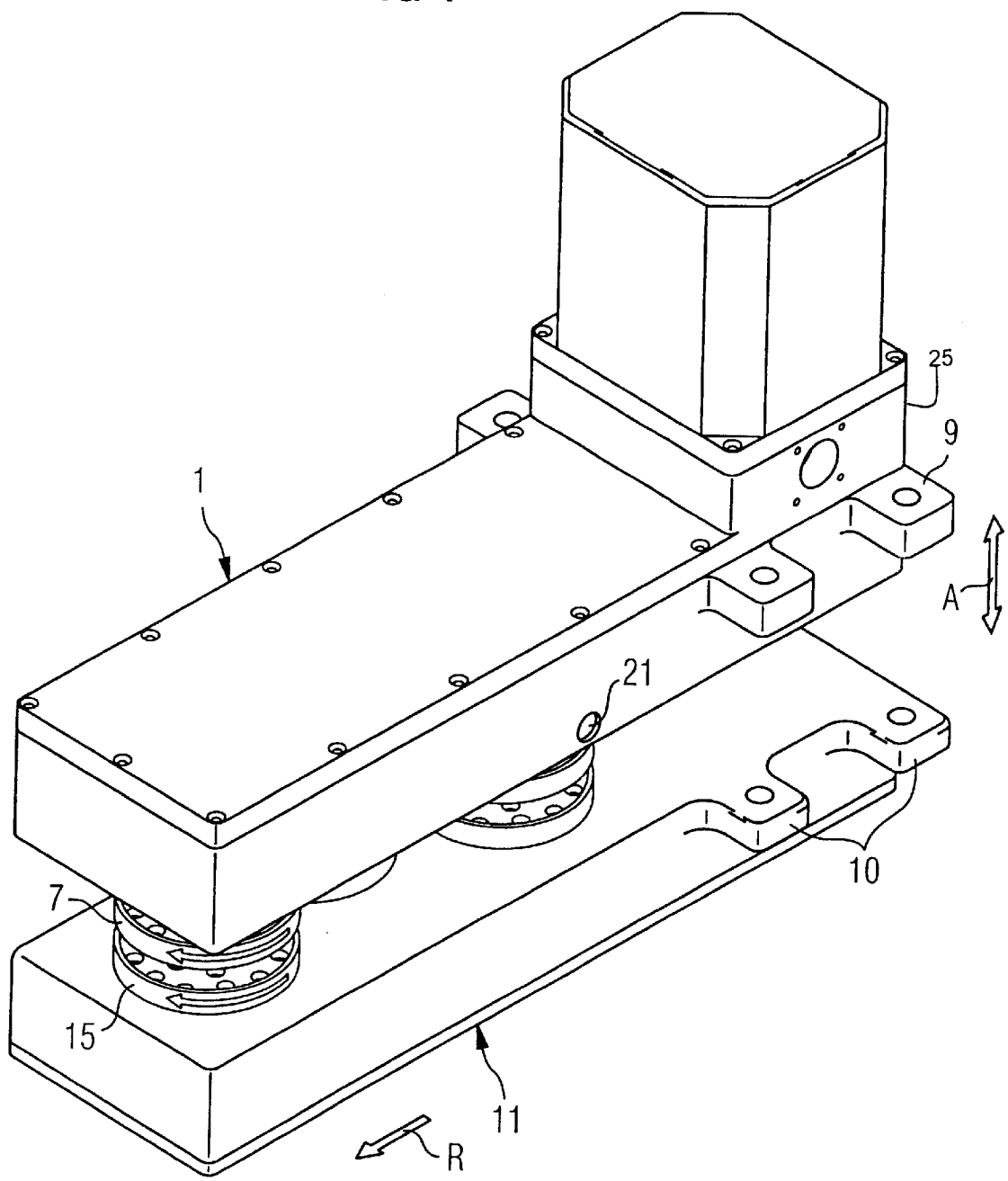
FIG. 1 shows a front perspective view of a brush device according to the invention.

In all the figures of the drawing, sub-features and integral parts that correspond to one another bear the same reference symbol in each case.

Referring now to the figures of the drawings in detail and first, particularly to FIG. 1 thereof, there is shown by way of example a brush device with an upper and lower gear casing 1 and 11. Between the gear casings 1 and 11, three brush units can be seen, the middle brush unit being offset laterally with respect to the two others and is therefore only partly visible in the perspective chosen. The brush units are formed in each case by the receiving plates 7 and 15 of the upper and lower gear casings 1 and 11, disposed coaxially one above the other at a variable distance "A". Not shown are the actual brushes, which must be present in each receiving plate during operation of the device. The brushes are usually in each case fitted or clamped into their receiving plates 7 and 15.

The "CMP-SCRUBN-200" brush device represented is configured for being integrated into the surroundings (not represented) of a CMP machine known per se, with a number of working stations, in particular by the holding fixtures 9 on the upper gear casing 1 and similar holding fixtures 10 on the lower gear casing 11. For better understanding of the invention, the general sequence for the removal of the abrasive agent suspension by the scrubber according to the invention is explained below.

The wafer to be cleaned may be in a horizontal position. The brush device is then driven on guide rails in the longitudinal direction that is to the bottom left in the direction "R" in the representation chosen in FIG. 1, into a position above and below the wafer. After this positioning, the lower gear casing 11, for example, is moved upward by air pressure, in order to clamp the wafer between the upper and lower sets of brushes. The brushes are all rotated in the same direction by the motor 2 mounted on the upper gear casing 1 and the upper and lower gear mechanisms 4 and 12, which are explained in more detail further below in relation to FIGS. 2 and 3, while deionized water is applied from above, via the moistening system integrated in the upper gear casing 1, and by further nozzles attached in the vicinity of the wafer. The offset, asymmetric configuration of the brush units rotates the wafer in the running water and, as a result, cleans its entire surface. After a predetermined time for ending the cleaning, typically about 15 to 20 seconds, the brush device is returned from the described cleaning position into its stationary position and the cleaned wafer can subsequently be further transported or processed.

Figure 2:
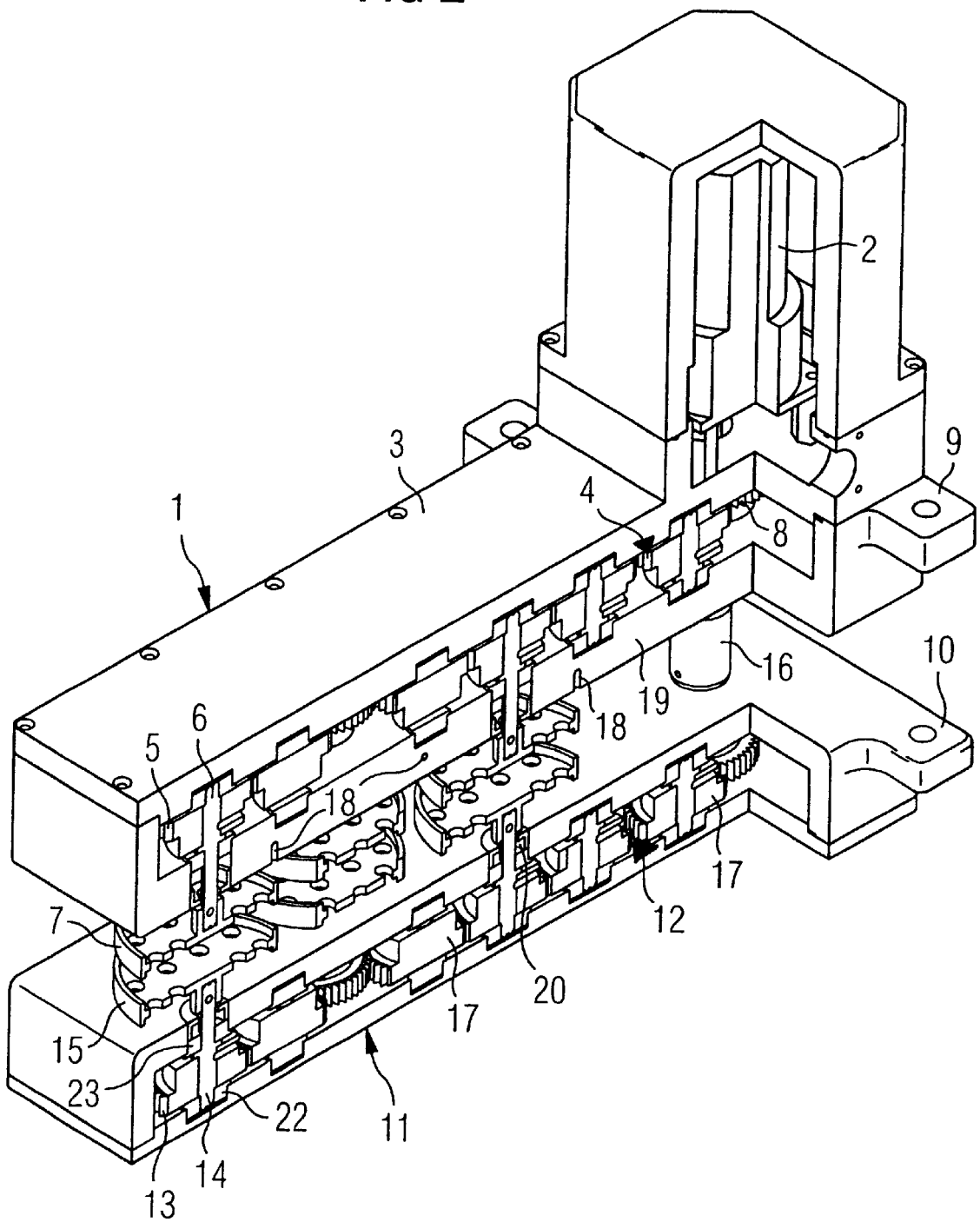
FIG. 2 shows a front perspective, sectional view of the brush device according to FIG. 1.

A detailed representation of the internal construction of the upper and lower gear casings 1 and 11 is shown in FIG. 2. The upper gear casing 1 has an upper side 3 with an end 25. The motor 2 and the upper and lower gear mechanisms 4 and 12 are encapsulated. The three upper receiving plates 7 and the respectively coaxially disposed lower receiving plates 15 are driven in each case via a shaft 6 and 14, respectively, by an associated drive wheel 5 and 13, respectively. The drive wheels 5 and 13 are configured in a way similar to the intermediate wheels 17, which are disposed in between the drive wheels 5 and 13 and the drive shaft 8 of the motor 2 as toothed gearwheels. An exemplary embodiment of a possible gear transmission is described further below with reference to FIG. 3.

Also indicated in FIG. 2 is the moistening system 18 (cf. the water connection 21 represented in FIG. 1), which is integrated into the lower casing wall 19 of the upper gear casing 1 in such a way that the upper gear mechanism 4 lying above it is constructed almost completely separately from the moistening system 18. The washing fluid could, if anything, run down on the shafts 14 into the lower gear casing 11, or reach the upper gear casing 1 as splash water near the shafts 6. This can be completely prevented by the upper and lower shafts 6 and 14 being sealed off by the shown shaft sealing rings known per se.

The lower gear casing 11 is substantially a mirror image of the upper gear casing 1. The lower gear casing 11 is only "substantially" a mirror image because it does not need to be shaped to enclose the motor 2.

The toothed gear mechanism, cf. also the bearings 22 and 23 shown on the basis of example of the shaft 6, have the effect that the brushes of the upper and lower sets of brushes, but also the two brushes of each brush unit with the wafer clamped in between, run at the same speed and with a defined contact pressure. This would not be possible in this form in the case of the known belt drive; rather, the unavoidable nonuniformities would cause twisting of the shafts 6 and 14 and consequently premature wearing of the associated bearings.

Figure 3:
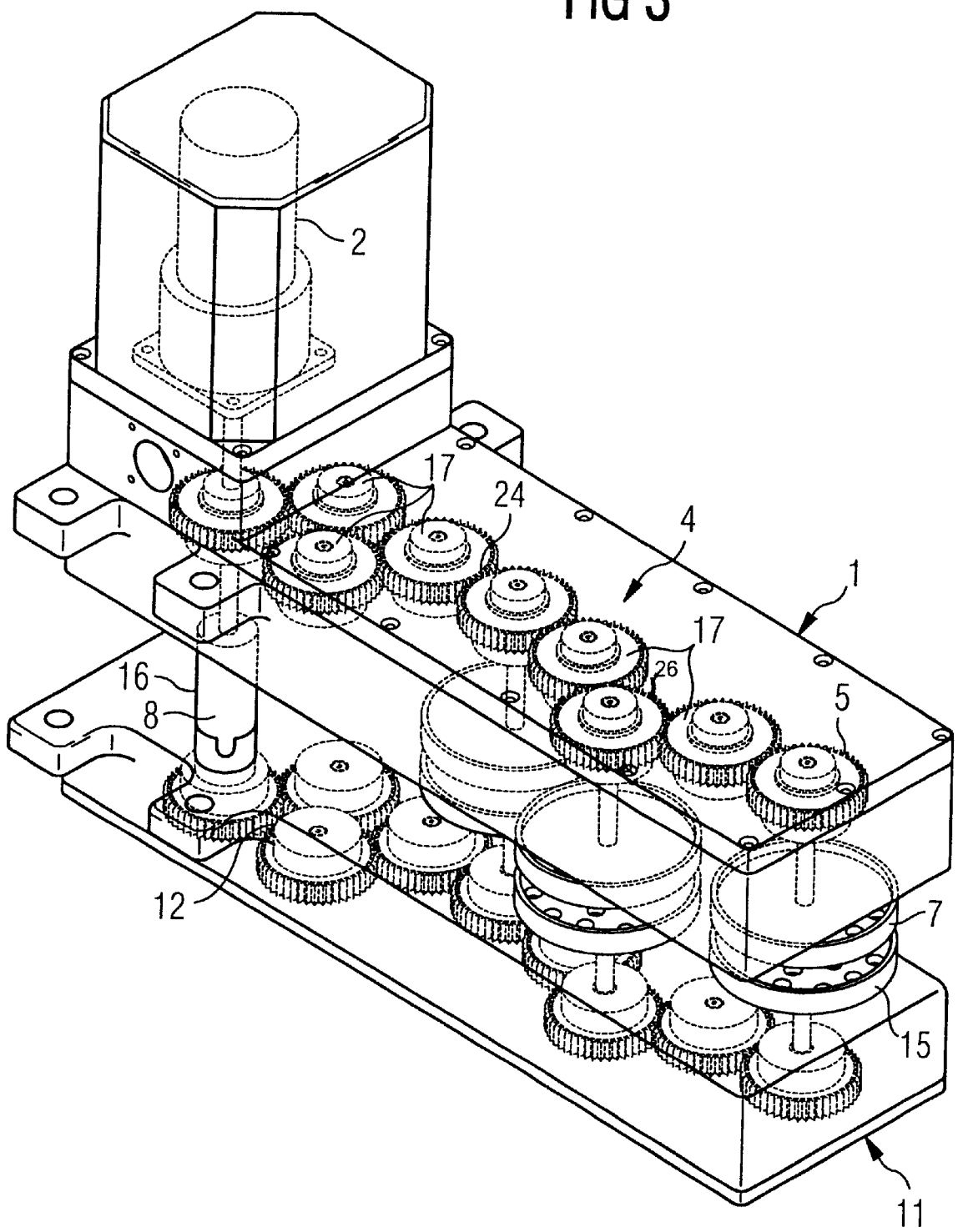
FIG. 3 shows a transparent rear perspective view of the brush device according to the invention.

FIG. 3 shows a gear transmission. The torque of the motor 2 is transmitted by the drive shaft 8 of the latter, as can be seen, by three intermediate wheels 17 to the first drive wheel 24. From the first drive wheel 24 to the second drive wheel 26, disposed in an offset manner, and from there to the third drive wheel 5, the rotation is transmitted in each case, as can be seen, by a further intermediate wheel 17. The transmission shown ensures that the three drive wheels all rotate in the same direction, which is of course just the same as in the lower gear mechanism 12, which to this extent is of a completely analogous or mirror-symmetrical construction. The gear mechanisms 4 and 12 require a somewhat broader casing geometry in comparison with the known belt gear mechanism and make possible a somewhat flatter casing.

A coupling 16 of the driveshaft 8 connects the motor 2 to the lower gear mechanism 12.

I claim:

1. A device for cleaning a wafer of abrasive agent suspension (slurry) remaining after polishing with brushes and DI water, the device comprising:

an upper gear casing having an upper side with an end, said upper gear casing being impervious to washing fluid;

a motor disposed on said end and encapsulated in said upper gear casing;

a drive shaft connected to said motor running perpendicular to said upper side;

an upper gear mechanism encapsulated in said upper gear casing and connected to said drive shaft including an intermediate wheel having teeth turned by said drive shaft, an upper drive wheel having teeth intermeshed with and driven by said intermediate wheel, a shaft connected to said upper drive wheel, and a receiving plate for holding a brush connected to and driven by said upper drive wheel via said shaft, said receiving plate being disposed underneath said upper gear casing, parallel to said upper side;

a coupling connected to said drive;

a lower gear casing substantially mirroring said upper gear casing, said lower gear casing receiving said coupling, and said lower gear casing and said upper gear casing being fixed one above the other; and a lower gear mechanism encapsulated in said lower gear casing including an intermediate wheel having teeth rotated by said coupling, and a lower drive wheel having teeth intermeshed with and rotated by said intermediate wheel and connected via a shaft to a lower receiving plate for holding brushes, said lower receiving plate being coaxial with said upper receiving plate, said lower receiving plate and upper receiving plate forming a brush unit, between which a part of a wafer can be clamped and cleaned by rotating said brush unit; said lower gear mechanism turning said lower drive wheel in the same direction as said upper drive wheel.

2. The device according to claim 1, including a moistening system for said brush unit integrated into a lower casing wall of said upper gear casing, said moistening system being sealed and separated from said upper gear mechanism.

3. The device according to claim 1, including shaft sealing rings each sealing a shaft into a respective gear casing.

4. The device according to claim 1, wherein said upper gear mechanism includes:

a first further upper drive wheel, a first further upper receiving plate, and a first further upper shaft interconnecting said first further drive wheel and said first further receiving plate;

a second further upper drive wheel, a second further upper receiving plate, and a second further upper shaft interconnecting said second further upper drive wheel and said second further upper receiving plate; said first further upper drive wheel and said second further upper drive wheel being disposed along a longitudinal direction of said upper gear casing, said first further upper drive wheel being offset in a transverse direction; and four further intermediate wheels, two of said four further intermediate wheels being interposed in series along with said first intermediate wheel between said drive shaft and said upper drive wheel, a third of said four further intermediate wheels being disposed between and engaging with said upper drive wheel and said first further upper drive wheel, a fourth of said four further intermediate wheels being disposed between and engaging with said first further upper drive wheel and said second further upper drive wheel; and wherein said lower gear mechanism includes:

a first further lower drive wheel, a first further lower receiving plate, and a first further lower shaft interconnecting said first further drive wheel and said first further receiving plate;

a second further lower drive wheel, a second further lower receiving plate, and a second further lower shaft interconnecting said second further lower drive wheel and said second further lower receiving plate; said first further lower drive wheel and said second further lower drive wheel being disposed along a longitudinal direction of said lower gear casing, said first further lower drive wheel being offset in a transverse direction; and four further intermediate wheels, two of said four further intermediate wheels being interposed in series along with said first intermediate wheel between said drive shaft and said lower drive wheel, a third of said four further intermediate wheels being disposed between and engaging with said lower drive wheel and said first further lower drive wheel, a fourth of said four further intermediate wheels being disposed between and engaging with said first further lower drive wheel and said second further lower drive wheel.

5. The device according to claim 1, wherein said gear casings are formed from natural polypropylene.

\* \* \* \* \*